(12) United States Patent
McClure et al.

(10) Patent No.: US 6,995,398 B2
(45) Date of Patent: Feb. 7, 2006

(54) METHODS OF TREATING A SILICON CARBIDE SUBSTRATE FOR IMPROVED EPITAXIAL DEPOSITION AND RESULTING STRUCTURES AND DEVICES

(75) Inventors: Davis Andrew McClure, Cary, NC (US); Alexander Suvorov, Durham, NC (US); John A. Edmond, Cary, NC (US); David B. Slater, Jr., Raleigh, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/709,780

(22) Filed: May 27, 2004

(65) Prior Publication Data

US 2005/0029526 A1 Feb. 10, 2005

Related U.S. Application Data

(62) Division of application No. 10/248,586, filed on Jan. 30, 2003.

(60) Provisional application No. 60/355,034, filed on Feb. 8, 2002.

(51) Int. Cl.
*H01L 31/0312* (2006.01)
(52) U.S. Cl. ............................. 257/77; 257/79; 257/86
(58) Field of Classification Search .................. 257/77, 257/79, 489, 86
See application file for complete search history.

(56) References Cited

U.S. PATENT DOCUMENTS

| | | | |
|---|---|---|---|
| 3,629,011 A | 12/1971 | Tohi et al. | |
| 5,027,168 A | * 6/1991 | Edmond | ..................... 257/103 |
| 5,273,933 A | 12/1993 | Hatano et al. | |
| 5,523,589 A | 6/1996 | Edmond et al. | |
| 5,786,606 A | 7/1998 | Nishio et al. | |
| 5,900,647 A | 5/1999 | Inoguchi | |
| 6,120,600 A | 9/2000 | Edmond et al. | |
| 6,187,606 B1 | 2/2001 | Edmond et al. | |
| 6,232,244 B1 | 5/2001 | Ibok | |
| 6,277,707 B1 | 8/2001 | Lee et al. | |
| 6,552,376 B1 | 4/2003 | Koike et al. | |
| 6,555,452 B2 | 4/2003 | Nikolaev et al. | |
| 6,632,694 B2 | 10/2003 | Torvik | |
| 6,667,495 B2 | 12/2003 | Friedrichs et al. | |
| 2002/0031851 A1 | 3/2002 | Linthicum et al. | |
| 2003/0006417 A1 | 1/2003 | Klosowiak et al. | |

FOREIGN PATENT DOCUMENTS

DE 199 44 144 A1 4/2001

(Continued)

OTHER PUBLICATIONS

F.J. Campos et al.; Confocal Micro-Raman Characterization of Lattice Damage in High Energy Aluminum Implanted 6H-SIC; Journal of Applied Physics; Jan. 1, 1999; pp. 99-104; vol. 85, No. 1: American Institute of Physics, New York, US.

(Continued)

*Primary Examiner*—Thien F. Tran
(74) *Attorney, Agent, or Firm*—Summa, Allan & Additon, P.A.

(57) ABSTRACT

A method is disclosed for treating a silicon carbide substrate for improved epitaxial deposition thereon and for use as a precursor in the manufacture of devices such as light emitting diodes. The method includes the steps of implanting dopant atoms of a first conductivity type into the first surface of a conductive silicon carbide wafer having the same conductivity type as the implanting ions at one or more predetermined dopant concentrations and implant energies to form a dopant profile, annealing the implanted wafer, and growing an epitaxial layer on the implanted first surface of the wafer.

34 Claims, 3 Drawing Sheets

FOREIGN PATENT DOCUMENTS

| WO | WO 00/16382 | * | 3/2000 |
|---|---|---|---|
| WO | WO 00/79570 A2 | | 12/2000 |

OTHER PUBLICATIONS

M.B. Scott et al.; High temperature (500 degrees C) Implantation study of P+ and N+ implanted epitaxial N-type 4H-SIC; Compound Semiconductors 1998, Proceedings of the 25th International Symposium on Compound Semiconductors; Nara, Japan, Oct. 12-16, 1998; pp. 763-768; vol. NR. 162; Institute of Physics Conference Series, London.

Issey Ohta et al.; An Ideal-Profile Implantation Process for GaAs Analog MMICs; Proceedings of the Gallium Arsenide Circuit Symposium, Grenelefe, Fla., Oct. 28-30, 1986; pp. 55-58; vol. SYMP. 8; IEEE, New York, US.

W.M. Duncan et al.; A Single Step Selective Implantation Technology for Multiply Doped Layers Using Proximity Annealing; IEEE Electron Device Letters; Dec. 1981; pp. 309-311; vol. EDL-2, No. 12; IEEE Inc., New York. US.

H. J. Hovel; Implant Profile Adjustment with GaA1As Caps; IBM Technical Disclosure Bulletin; Feb. 1985; pp. 5360-5361; vol. 27, No. 9; IBM Corp., New York, US.

S. K. LEe et al.; Electrical characterization of TiC ohmic contacts to aluminum ion implanted 4H-silicon carbide; Applied Physics Letters; Sep. 4, 2000; pp. 1478-1480; vol. 77, No. 10.

* cited by examiner

METHODS OF TREATING A SILICON CARBIDE SUBSTRATE FOR IMPROVED EPITAXIAL DEPOSITION AND RESULTING STRUCTURES AND DEVICES

CROSS REFERENCE TO RELATED APPLICATIONS

This application is based upon and claims priority from provisional application Ser. No. 60/355,034 filed Feb. 8, 2002.

BACKGROUND OF INVENTION

To date, the most successful materials for producing light emitting devices or "LEDs" (including light emitting diodes, laser diodes, photodetectors and the like) capable of operation in the UV, blue and green portions of the electromagnetic spectrum have been the group III-nitride compound semiconductor materials, and in particular gallium nitride-based compound semiconductors. However, gallium nitride presents a particular set of technical problems in manufacturing working devices. The primary problem is the lack of bulk single crystals of gallium nitride which in turn means that gallium nitride or other group III-nitride devices must be formed as epitaxial layers on other materials. Sapphire (i.e., aluminum oxide or $Al_2O_3$) has been commonly used as a substrate for group III-nitride devices. Sapphire offers a reasonable crystal lattice match to Group III nitrides, thermal stability, and transparency, all of which are generally useful in producing a light emitting diode. Sapphire offers the disadvantage, however, of being an electrical insulator. This means that the electric current that is passed through an LED to generate the emission cannot be directed through the sapphire substrate. Thus, other types of connections to the LED must be made, such as placing both the cathode and anode of the device on the same side of the LED chip in a so-called "horizontal" configuration. In general, it is preferable for an LED to be fabricated on a conductive substrate so that ohmic contacts can be placed at opposite ends of the device. Such devices, called "vertical" devices, are preferred for a number of reasons, including their easier manufacture as compared to horizontal devices.

In contrast to sapphire, silicon carbide can be conductively doped, and therefore can be effectively used to manufacture a vertical group III-nitride LED. In addition, silicon carbide has a relatively small lattice mismatch with gallium nitride, which means that high-quality group III-nitride material can be grown on it. Silicon carbide also has a high coefficient of thermal conductivity, which is important for heat dissipation in high-current devices such as laser diodes.

Examples of silicon carbide-based group III-nitride LEDs are shown in U.S. Pat. Nos. 5,523,589, 6120,600 and 6,187,606 each of which is assigned to Cree, Inc., the assignee of the present invention, and each of which is incorporated herein by reference. Such devices typically comprise a silicon carbide substrate, a buffer layer or region formed on the substrate, and a plurality of group III-nitride layers forming a p-n junction active region.

In particular, U.S. Pat. No. 6,187,606 represents an important advance over the state of the art as it previously existed. The invention described in the '606 patent provided a plurality of discrete crystal portions, or "dots," of GaN or InGaN on the substrate in an amount sufficient to minimize or eliminate the heterobarrier between the substrate and the buffer layer. A highly conductive path between the substrate and the active region could thereby be established.

An important parameter for LEDs is the forward voltage ($V_f$) drop between the anode and the cathode of the device during forward bias operation. In particular, it is desirable for the forward voltage ($V_f$) a device to be as low as possible to reduce power consumption and increase the overall efficiency of the device. Despite the advance of the '606 patent, there remains a measurable voltage drop at the interface between a conventional silicon carbide substrate and the conductive buffer layer. It is desirable to reduce this voltage drop in order to reduce the overall $V_f$ of the resulting device.

SUMMARY

The invention is a light emitting diode comprising a silicon carbide wafer having a first and second surface and having a predetermined conductivity type and an initial carrier concentration. A region of implanted dopant atoms extends from the first surface into the silicon carbide wafer for a predetermined distance, the region having a higher earner concentration than the initial carrier concentration in the remainder of the wafer. A conductive buffer region is on the first surface of the conductive silicon carbide wafer, an active region is on the conductive buffer region, a first ohmic contact is on said active region, and a second ohmic contact is on the second surface of the silicon carbide wafer.

DETAILED DESCRIPTION

Methods according to embodiments of the present invention include the steps of providing a SiC wafer having a predetermined conductivity type and first and second surfaces; implanting dopant atoms of the predetermined conductivity type into the first surface of the SiC wafer at one or more predetermined dopant concentrations and implant energies to form a dopant profile; annealing the implanted wafer; and growing an epitaxial layer on the implanted first surface of the substrate. Other methods according to embodiments of the present invention include the steps of providing a SiC wafer having a predetermined conductivity type and first and second surfaces; forming a capping layer on the first surface of the wafer; implanting dopant atoms of the predetermined conductivity type into the capping layer and the first surface of the SiC wafer at one or more predetermined dopant concentrations and implant energies to form a dopant profile; annealing the implanted wafer; removing the capping layer; and growing an epitaxial layer on the implanted first surface of the substrate.

Structures according to embodiments the present invention include a silicon carbide substrate having a predetermined conductivity type and having first and second surfaces with a first implantation profile of implanted dopants of the predetermined conductivity type adjacent the first surface and an epitaxial layer grown on the first surface.

Devices according to embodiments of the present invention include a light emitting device comprising a silicon carbide substrate having a predetermined conductivity type and first and second surfaces, a conductive buffer layer on the first surface of the substrate, and an active region on the conductive buffer, wherein the first surface of the substrate has a first implantation profile of implanted dopants of the predetermined conductivity type adjacent the first surface.

Figure 1:
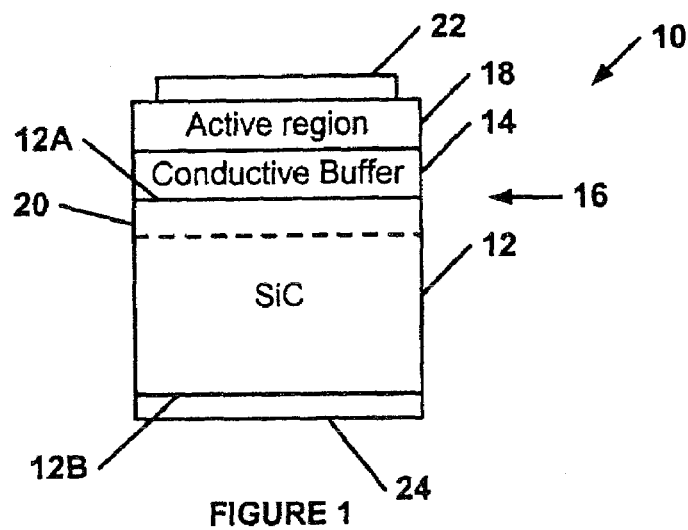
FIG. 1 is a simplified schematic of a silicon carbide based light emitting diode according to the present invention.

Referring to FIG. 1 which shows a simplified schematic of a silicon carbide-based LED according to the present invention, device 10 comprises a conductive silicon carbide substrate 12 having a first conductivity type and having a first surface 12A and a second surface 12B. Device 10 further includes a conductive buffer region 14 formed on surface 12A of substrate 12 and an active region 18 formed on the conductive buffer 14. Active region 18 preferably includes a p-n junction and most preferably comprises a single heterostructure, double heterostructure, single quantum well, multiple quantum well or the like. A first ohmic contact 22 is formed on the surface of the active region. A second ohmic contact 24 is formed on the surface of the substrate 24. In a preferred embodiment, substrate 12 comprises n-type 4H-silicon carbide. Accordingly, in a preferred embodiment ohmic contact 22 comprises the anode of the device 10 while ohmic contact 24 comprises the cathode of the device 10. Ohmic contact 24 may be formed according to the methods described in U.S. patent application Ser. No. 09/787,189 filed Mar. 15, 2001 which is incorporated herein by reference. Substrate 12 includes a first implanted region 20 adjacent to surface 12A and comprising implanted dopant atoms of the first conductivity type. The presence of implanted region 20 causes a reduction in the voltage drop observable at the interface between substrate 12 and buffer region 14, which results in a reduction in the overall forward operating voltage ($V_f$) of the device 10. The implanted region has a peak concentration of implanted dopant atoms of between about 1E19 and 5E21 $cm^{-3}$ and is between about 10 and 5000 Å thick. Preferably, the implanted region has a peak concentration of implanted dopant atoms of about 1E21 $cm^{-3}$ and is about 500 Å thick.

Figure 2:
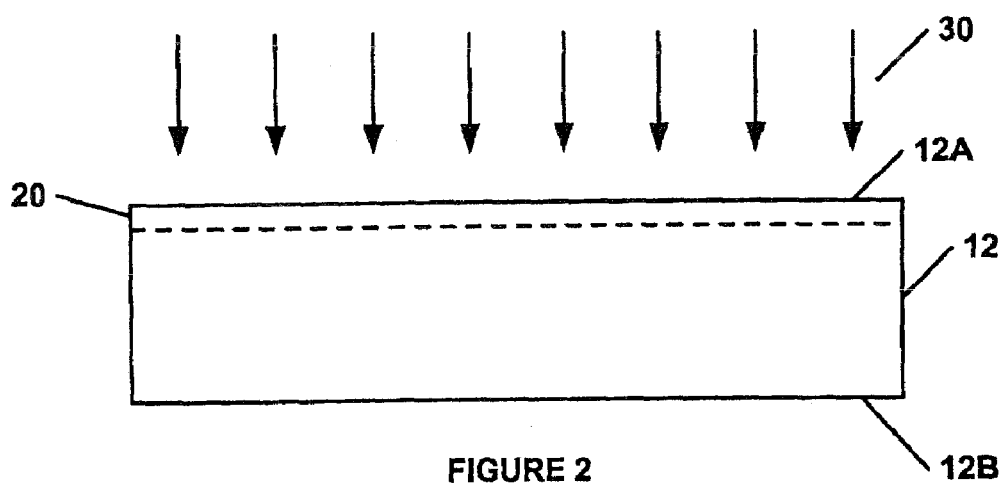
FIG. 2 is a schematic illustration of a method of fabricating structures according to the present invention.

FIG. 2 illustrates a method of fabrication of structures according to the present invention. A silicon carbide substrate 12 is provided having a first conductivity type and having first surface 12A and second surface 12B. The fabrication of doped silicon carbide substrates such as substrate 12 is well known in the art. For example, U.S. Pat. No. RE34,861 discloses a process for growing boules of silicon carbide via controlled seeded sublimation. The resulting silicon carbide crystal may exhibit one of a number of polytypes, such as 4H, 6H, 15R or others. N-type dopants such as nitrogen and/or phosphorus or p-type dopants such as aluminum and/or boron may be incorporated into the crystal during growth to impart a net n-type or p-type conductivity, respectively. The crystal boules are then sliced into wafers which are chemically and mechanically treated (polished) to provide a suitable substrate for the growth of epitaxial layers and the fabrication of electronic devices thereon.

In a preferred embodiment, substrate 12 comprises n-type 4H or 6H-silicon carbide doped with nitrogen donor atoms at a net dopant concentration of about 5E17 to 3E18 $cm^{-2}$.

Subsequent to wafering and polishing, dopant atoms 30 of a predetermined conductivity type are implanted into surface 12A of substrate 12 at one or more predetermined dopant concentrations and implant energies to form a dopant profile in implanted region 20 of substrate 12. Preferably, dopant atoms 30 have the same conductivity type as substrate 12. That is, if substrate 12 is n-type, then dopants 30 comprise a dopant such as nitrogen and/or phosphorus that imparts n-type conductivity in silicon carbide. Alternatively, if substrate 12 is p-type, then dopants 30 comprise a dopant such as boron or aluminum that imparts p-type conductivity in silicon carbide.

Dopants 30 are implanted into substrate 12 through surface 12A according to an predetermined implant dose and energy level. Implantation may be performed in one step at a single dose and energy level or in a plurality of steps at multiple doses and/or multiple energy levels. In a preferred embodiment, implantation is performed via a plurality of implant doses and energy levels in order to impart a relatively flat implantation profile to a predetermined depth within substrate 12. For example, in one embodiment, a 6H-silicon carbide substrate is implanted with phosphorus atoms at a first dose of 2E15 $cm^{-2}$ and an energy of 25 keV and a second dose of 3.6E15 $cm^{-2}$ at an energy of 50 keV.

Figure 4:
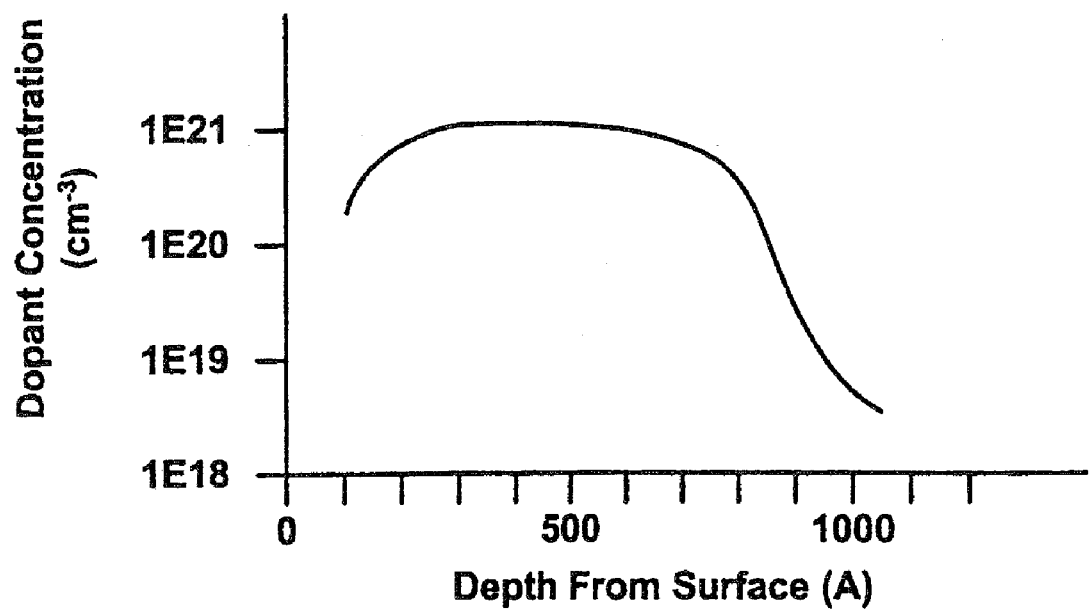
FIG. 4 is a plot of the profile of implanted ions as a function of depth from the surface for a substrate according to the present invention.

A schematic of a desired depth profile that could be formed according to this embodiment is shown the graph of FIG. 4. The graph of FIG. 4 shows the profile of implanted atoms in atoms/$cm^3$ (y-axis) as a function of depth in angstroms from the first surface 12A of substrate 12 (x-axis). As shown in FIG. 4, the implant profile increases to a maximum of about 1E21 $cm^{-3}$ at a depth of about 300 Å. From there, the profile stays relatively flat to a depth of about 800 Å, and then begins to drop off to background levels. Accordingly, implanted region 20 may be said to extend from surface 12A into substrate 12 for a depth of about 800–1000 Å.

Following the implantation, the substrate is annealed in a standard tube anneal in Argon at a temperature of 1300° for 90 minutes to activate the implanted dopants. A range of temperatures is also effective for annealing, with 1300° being exemplary rather than limiting.

A conductive buffer 14 may then formed on surface 12A of substrate 12.

One drawback of this embodiment is that the dopant profile tends to reach its maximum at some depth within the substrate, determined by the implant doses and energies. That is, the implant concentration at the surface is less than the maximum concentration within the substrate. Implanted dopant concentrations must be kept at less than about 5E21 $cm^{-3}$ or else the implanted atoms will cause unwanted and irreparable damage to the crystal lattice of substrate 12.

In order to provide the maximum improvement in voltage drop, it is desirable to have the implant concentration at the surface at the surface of the substrate at as high a level as possible, i.e., the implant concentration at the surface should be around 1E21 $cm^{-3}$. However, in order to achieve such a surface concentration according to the embodiment of FIG. 2, it would be necessary to implant the dopant atoms at a dose and energy level that would produce dopant concentrations within the substrate that would damage the substrate as described above.

Figure 3:
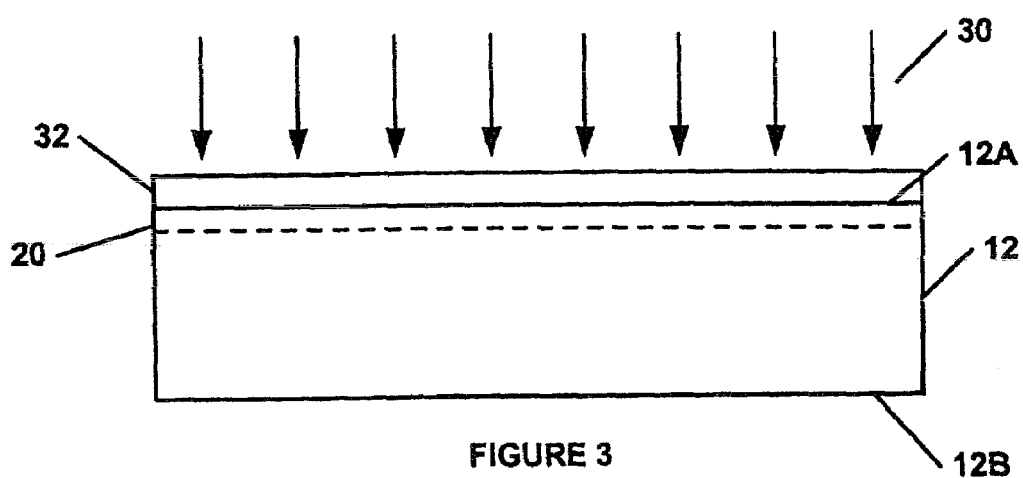
FIG. 3 is another schematic illustration of a method of fabricating structures according to the present invention.

Accordingly, in another embodiment of the invention illustrated in FIG. 3, a capping layer 32 is deposited on surface 12A of substrate 12 prior to dopant implantation. Preferably, capping layer 32 comprises a silicon nitride layer or a silicon dioxide layer deposited using Plasma-Enhanced Chemical Vapor Deposition (PECVD) or grown as a thermal oxide, both of which are well known processes capable for depositing oxide layers of precise thickness and composition. Capping layer 32 may also comprise any other suitable material that may be controllably deposited in thin layers, is susceptible to ion implantation and can be removed without damaging the underlying surface. Other possible materials for capping layer 32 include a metal layer or an epitaxial semiconductor layer.

The thickness of capping layer 32 and the implantation parameters (dose and energy) are selected such that the maximum implant concentration resulting from the implantation step occurs at or near the surface 12A of the substrate 12 (i.e., at or near the interface between substrate 12 and capping layer 32). The resulting structure is then annealed in a standard tube anneal in argon at a temperature of 1300° C. for 90 minutes to activate the implanted dopants. Capping layer 32 is removed using conventional techniques. For example, if capping layer 32 comprises a PECVD oxide layer, it may be removed with a wet chemical etch process. The resulting structure then ideally comprises a substrate 12 having an implanted region 20 wherein the peak concentration of implanted atoms in the implanted region 20 occurs at or near surface 12A of substrate 12.

Figure 5:
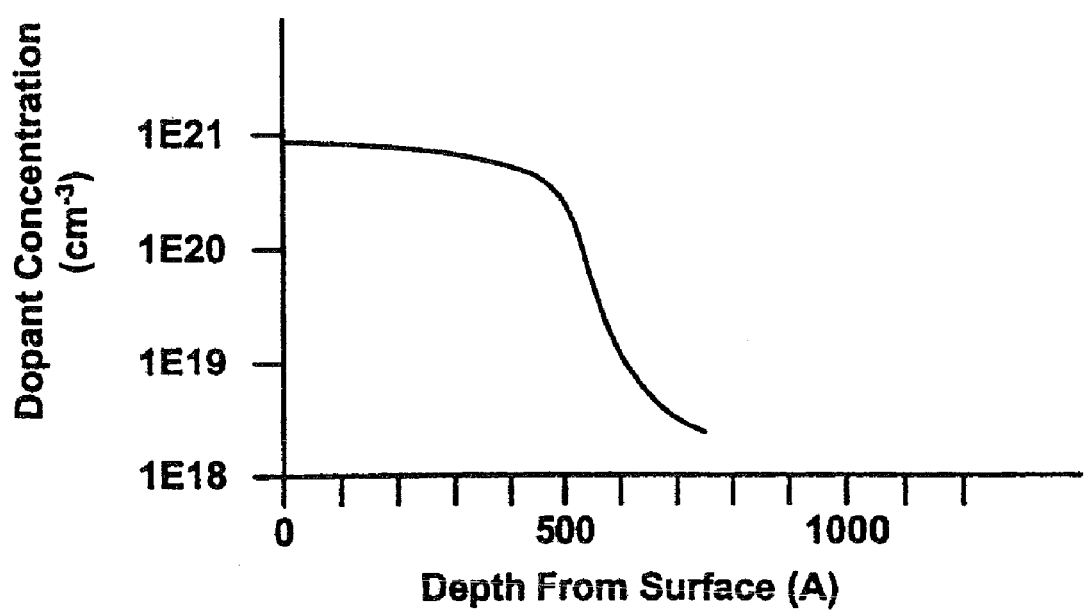
FIG. 5 is another schematic illustration of the desired depth profile that can be formed according to an embodiment of the invention.

A schematic of the desired depth profile that could be formed according to this embodiment is shown the graph of FIG. 5. The graph of FIG. 5 shows a schematic profile of implanted atoms in atoms/cm3 (y-axis) as a function of depth in angstroms from the first surface 12A of substrate 12. As shown in FIG. 4, the implant profile is approximately $1E21$ $cm^{-3}$ at a the surface 12A of the substrate 12. From there, the profile stays relatively flat for a depth of about 500 A, and then begins to drop off to background levels.

In one embodiment, a silicon dioxide layer 32 having a thickness of about 500 A is formed via PECVD on surface 12A of substrate 12. Nitrogen atoms are implanted into the oxide layer and the substrate 12 in a first dose at an implant energy of 25 keV and a second dose at an implant energy of 50 keV. The first implant may have a dose of about $4E12$ $cm^{-2}$ to $1E15$ $cm^{-2}$, while the second implant hay have a dose of about $7E12$ $cm^{-2}$ to $1.8E15$ $cm^{-2}$.

Figure 6:
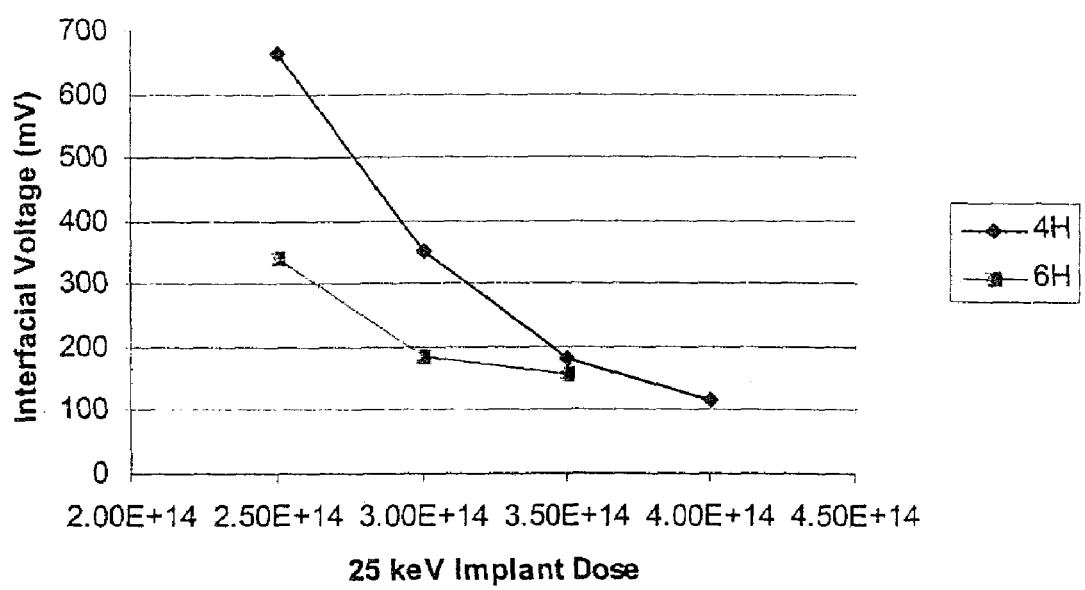
FIG. 6 is a plot of interfacial voltage at the substrate/buffer interface versus 25 keV implant dose for implanted substrates according to the invention.

A graph of the interfacial voltage ($V_f$) at the substrate/buffer region interface versus 25 keV implant dose is shown in FIG. 6. To generate the data shown in FIG. 6, sample 4H and 6H silicon carbide wafers having a net concentration of nitrogen dopants of between $3.3E17$ and $2.1E18$ $cm^{-3}$ were employed. A 500 Å thick PECVD silicon dioxide layer was formed on the surface of the wafers, and the wafers were implanted with various controlled doses of nitrogen at energy levels of 25 keV and 50 keV respectively. The implant doses and energy levels for each wafer are shown in Table I.

TABLE 1

| Wafer | Type | Dopant | 25 keV Dose per square cm | 50 keV Dose (per square cm) |
|---|---|---|---|---|
| A | 4H | 28N2+ | 2.5E14 | 4.38E14 |
| B | 4H | 28N2+ | 3.0E14 | 5.25E14 |
| C | 4H | 28N2+ | 3.5E14 | 6.13E14 |
| D | 4H | 28N2+ | 4.0E14 | 7.0E14 |
| E | 6H | 28N2+ | 2.5E14 | 4.38E14 |
| F | 6H | 28N2+ | 3.0E14 | 5.25E14 |
| G | 6H | 28N2+ | 3.5E14 | 6.13E14 |

Conductive buffers were then formed on the implanted substrates. The interfacial voltage (i.e., the voltage drop attributable to the substrate/buffer interface) was measured at three locations on the wafer and an average value was calculated. The average values are plotted against the 25 keV implant dose in FIG. 6. As shown in FIG. 6, the interfacial voltage of the substrate/buffer interface decreases with increasing dosage.

The invention claimed is:

1. A light emitting diode comprising: a silicon carbide wafer having a first and second surface and having a predetermined conductivity type and an initial carrier concentration, a region of implanted dopant atoms extending from said first surface into said silicon carbide wafer for a predetermined distance, said region having a higher carrier concentration than said initial carrier concentration in the remainder of said wafer; a conductive buffer region on said first surface of said conductive silicon carbide wafer; an active region on said conductive buffer region; a first ohmic contact to said active region; and a second ohmic contact on the second surface of said silicon carbide wafer.

2. An LED according to claim 1 wherein said active layer is a single heterostructure.

3. An LED according to claim 1 wherein said active layer is a double heterostructure.

4. An LED according to claim 1 wherein said active layer is a single quantum well.

5. An LED according to claim 1 wherein said active layer is a multiple quantum well.

6. An LED according to claim 1 wherein said silicon carbide wafer comprises n-type 6H-silicon carbide.

7. An LED according to claim 6 wherein said initial carrier concentration of said silicon carbide wafer comprises nitrogen.

8. An LED according to claim 7 wherein said carrier concentration of said nitrogen is about 5E17 to 3E18 $cm^{-3}$.

9. An LED according to claim 6 wherein said initial carrier concentration of said silicon carbide wafer comprises phosphorus.

10. An LED according to claim 1 wherein said region of implanted dopant atoms comprises phosphorus atoms with an implant concentration of between about 1E19 and 5E21 $cm^{-3}$.

11. An LED according to claim 10 wherein said region of implanted dopant atoms comprises phosphorus dopant atoms with an implant concentration of about 1E21 $cm^{-3}$.

12. An LED according to claim 1 wherein said region of implanted dopant atoms comprises nitrogen dopant atoms with an implant concentration of between about 1E19 and 5E21 $cm^{-3}$.

13. An LED according to claim 12 wherein said region of implanted dopant atoms comprises phosphorus atoms with an implant concentration of about 1E21 $cm^{-3}$.

14. An LED according to claim 1 wherein said silicon carbide wafer comprises n-type 4H-silicon carbide.

15. An LED according to claim 1 wherein said region of implanted dopant atoms extends from said first surface into said silicon carbide wafer to a depth of between about 10 and 5000 Angstroms.

16. An LED according to claim 1 wherein said region of implanted dopant atoms extends from said first surface into said silicon carbide wafer to a depth of between about 800 and 1000 Angstroms.

17. An LED according to claim 1 wherein said region of implanted dopant atoms has a peak concentration of implanted dopant atoms of between about 1E19 and 5E21 $cm^{-3}$.

18. An LED according to claim 17 wherein said region of implanted dopant atoms has a peak concentration of implanted dopant atoms of about 1E21 $cm^3$ and extends from said first surface into said silicon carbide wafer to a depth of about 500 Angstroms.

19. An LED according to claim 1 wherein the peak concentration of implanted atoms in said implanted region occurs at or near the first surface of said silicon carbide substrate.

20. A light emitting diode ("LED") comprising: a silicon carbide wafer having a first and second surface and having a predetermined conductivity type and an initial carrier concentration; a conductive buffer region on the first surface of said silicon carbide substrate; a region of implanted dopant atoms having the same conductivity as said wafer and extending from said first surface into said silicon carbide wafer for a predetermined distance causing a reduction of the overall forward voltage drop observable at the interface between said wafer and said conductive buffer region; an active region on said conductive buffer region; an ohmic contact to said active region; and an ohmic contact on said second surface of said silicon carbide substrate.

21. An LED according to claim 20 wherein said implanted region has a peak concentration of implanted dopant atoms of between about 1E19 and 5E21 $cm^{-3}$.

22. An LED according to claim 20 wherein said implanted region has a thickness of between about 10 and 5000 Angstroms.

23. An LED according to claim 20 wherein said implanted region has a peak concentration of implanted dopant atoms of about 1E21 $cm^{-3}$ and is about 500 Angstroms thick.

24. An LED according to claim 20 wherein said implanted region is doped with atoms selected from the group consisting of nitrogen and phosphorus.

25. An LED according to claim 20 wherein said implanted region comprises phosphorus donor atoms implanted with first dose at a net dopant concentration of 2E15 $cm^{-2}$ at an energy of 25 keV and a second dose at a net dopant concentration of 3.6E15 $cm^{-2}$ at an energy of 50 keV.

26. An LED according to claim 20 wherein said region of implanted dopant atoms extends into said substrate to a depth of between about 800 and 1000 Angstroms.

27. An LED according to claim 20 wherein said active region is a single heterostructure.

28. An LED according to claim 20 wherein said active region is a double heterostructure.

29. An LED according to claim 20 wherein said active region is a single quantum well.

30. An LED according to claim 20 wherein said active region is a multiple quantum well.

31. An LED according to claim 20 wherein said silicon carbide wafer comprises n-type 6H-silicon carbide having an initial ion concentration of nitrogen donor atoms of between about 5E17 and 3E18 $cm^{-3}$ and wherein said region of implanted dopant atoms comprises phosphorus dopant atoms with an implant concentration of between about 1E19 and 5E21 $cm^{-3}$ and is about 500 Angstroms thick.

32. An LED according to claim 20 wherein said silicon carbide wafer comprises n-type 6H-silicon carbide having an initial ion concentration of nitrogen donor atoms of between about 5E17 and 3E18 $cm^{-3}$ and wherein said region of implanted dopant atoms comprises nitrogen dopant atoms with an implant concentration of between about 1E19 and 5E21 $cm^{-3}$ and is about 500 Angstroms thick.

33. An LED according to claim 20 wherein said silicon carbide wafer comprises n-type 4H-silicon carbide having an initial ion concentration of nitrogen donor atoms of between about 5E17 and 3E18 $cm^{-3}$ and wherein said region of implanted dopant atoms comprises phosphorus dopant atoms with an implant concentration of between about 1E19 and 5E21 $cm^{-3}$ and is about 500 Angstroms thick.

34. An LED according to claim 20 wherein said silicon carbide wafer comprises n-type 4H-silicon carbide having an initial ion concentration of nitrogen donor atoms of between about 5E17 and 3E18 $cm^{-3}$ and wherein said region of implanted dopant atoms comprises nitrogen dopant atoms with an implant concentration of between about 1E19 and 5E21 $cm^{-3}$ and is about 500 Angstroms thick.

* * * * *